United States Patent
Yeh et al.

(10) Patent No.: US 7,916,295 B2
(45) Date of Patent: Mar. 29, 2011

(54) ALIGNMENT MARK AND METHOD OF GETTING POSITION REFERENCE FOR WAFER

(75) Inventors: Chiao-Wen Yeh, Hsinchu (TW); Chih-Hao Huang, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 302 days.

(21) Appl. No.: 12/203,310

(22) Filed: Sep. 3, 2008

(65) Prior Publication Data

US 2010/0053616 A1   Mar. 4, 2010

(51) Int. Cl.
*G01B 11/00*   (2006.01)
*H01L 23/544*   (2006.01)

(52) U.S. Cl. ........................... 356/401; 257/797

(58) Field of Classification Search .................. 356/400, 356/401; 257/797
See application file for complete search history.

(56) References Cited

U.S. PATENT DOCUMENTS

| | | | |
|---|---|---|---|
| 5,294,975 A * | 3/1994 | Norman et al. | 356/401 |
| 5,528,372 A * | 6/1996 | Kawashima | 356/401 |
| 6,778,275 B2 * | 8/2004 | Bowes | 356/400 |
| 6,940,609 B2 | 9/2005 | Scheiner | |
| 7,288,848 B2 * | 10/2007 | Lee et al. | 257/797 |
| 7,408,642 B1 * | 8/2008 | DiBiase | 356/401 |
| 7,440,105 B2 * | 10/2008 | Adel et al. | 356/401 |
| 7,684,040 B2 * | 3/2010 | Yang | 356/401 |
| 2004/0185637 A1 * | 9/2004 | Fu et al. | 438/401 |
| 2005/0097764 A1 | 5/2005 | Kim | |
| 2007/0187606 A1 | 8/2007 | Adel et al. | |
| 2008/0106738 A1 * | 5/2008 | Kim | 356/399 |
| 2009/0096116 A1 * | 4/2009 | Yang | 257/797 |
| 2009/0225331 A1 * | 9/2009 | Van Haren | 356/614 |
| 2009/0246709 A1 * | 10/2009 | Nakasugi et al. | 430/319 |

* cited by examiner

*Primary Examiner* — L. G Lauchman
(74) *Attorney, Agent, or Firm* — J.C. Patents

(57) ABSTRACT

An alignment mark on a wafer is described, including at least one dense pattern and at least one block-like pattern adjacent thereto and shown as at least one dark image and at least one bright image adjacent thereto. A method of getting a position reference for a wafer is also described. An above alignment mark is formed. The alignment mark, which is shown as at least one dark image and at least one bright image adjacent thereto that are formed by the at least one dense pattern and the at least one block-like pattern, is then detected.

26 Claims, 3 Drawing Sheets

ALIGNMENT MARK AND METHOD OF GETTING POSITION REFERENCE FOR WAFER

BACKGROUND OF THE INVENTION

1. Field of the Invention

This invention relates to IC fabricating processes, and more particularly relates to an alignment mark, and a method of getting a position reference for a wafer that is based on the alignment mark.

2. Description of the Related Art

A wafer for IC fabrication usually requires a position reference to be defined thereon before subjected to a process, such as a checking process like overlay checking process. A position reference is often got by forming two alignment marks in the pre-layer at different positions and locating the alignment marks as two reference points.

FIG. 1 illustrates a prior-art alignment mark 100 on a wafer 10, which serves as one of two reference points 12 on the wafer 10 and includes an L-shaped pattern 110 and its surrounding 120. The alignment mark 100 is located by detecting brightness difference between the L-shaped pattern 110 and its surrounding 120.

However, when there is an opaque film, such as an amorphous carbon film, in the stack of films, the contrast between the L-shaped pattern 110 and its surrounding 120 is insufficient, so that the alignment mark 100 is difficult to locate and the recipe cannot be setup. Although the contrast can be increased by using near-IR light in the detection, additional tools for manipulating the near-IR detection are required.

SUMMARY OF THE INVENTION

Accordingly, this invention provides an alignment mark, which has a higher contrast facilitating its locating so that the recipe can be setup readily.

This invention also provides a method of getting a position reference for a wafer, which is based on the alignment mark of this invention.

An alignment mark of the invention includes at least one dense pattern and at least one block-like pattern adjacent thereto, and is shown as at least one dark image and at least one bright image adjacent thereto.

The method of getting a position reference for a wafer is described below. An alignment mark of this invention is formed. The alignment mark, which is shown as at least one dark image and at least one bright image adjacent thereto that are formed by the at least one dense pattern and the at least one block-like pattern, is then detected. The method may be applied to a checking process of the wafer, such as an overlay checking process.

In some embodiments, the at least one dense pattern includes an array pattern. The array pattern may include a plurality of parallel linear patterns, wherein each linear pattern may have an x-directional orientation or y-directional orientation. The array pattern may have only one pitch, or have two or more pitches. The array pattern may include a one-dimensional (1D) array pattern or a 2D array pattern.

In an embodiment, there are one dense pattern and a plurality of block-like patterns adjacent thereto, or one block-like pattern and a plurality of dense patterns adjacent thereto. Or, there are a plurality of dense patterns and a plurality of block-like patterns, wherein each dense pattern is adjacent to at least one block-like pattern and each block-like pattern is adjacent to at least one dense pattern.

Further, the at least one dense pattern and at least one block-like pattern may be formed from a portion of a pre-layer, or formed as openings in a portion of the pre-layer. It is also possible that at least one of the at least one dense pattern and the at least one block-like pattern has an irregular shape. The at least one block-like pattern may include a single block pattern, or include two or more neighboring block patterns.

Even when an opaque film is included in the film stack, the alignment mark of the invention is shown as at least one dark image and at least one bright image adjacent thereto as detected in visible light, and thus has a high contrast and can be located easily in visible light for the recipe setup. Hence, no additional tool for manipulating near-IR detection is required, and an opaque layer is allowed to be included in the film stack.

It is to be understood that both the foregoing general description and the following detailed description are exemplary, and are intended to provide further explanation of the invention as claimed.

DESCRIPTION OF THE PREFERRED EMBODIMENTS

It is particularly noted that though the dense patterns of the alignment marks in the following embodiments of this invention are all array patterns, the dense pattern of this invention can be other types of pattern, such as a rectangular spiral pattern or a pattern including a plurality of concentric rectangular rings.

Figure 1:
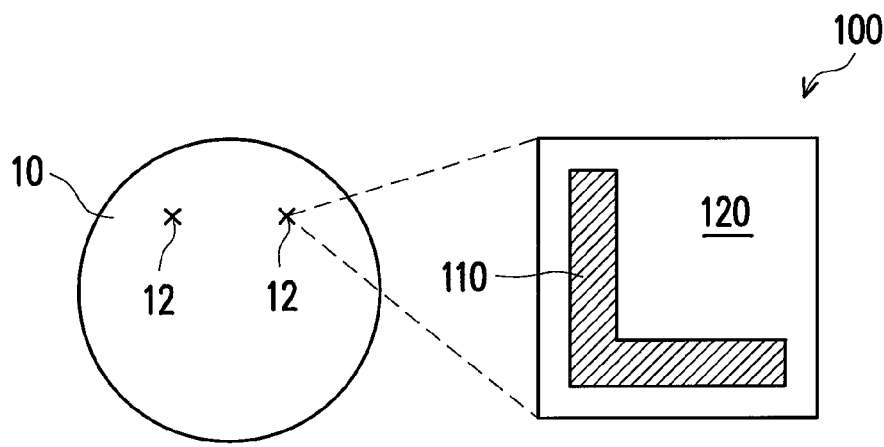
FIG. 1 illustrates a prior-art alignment mark on a wafer.
Figure 2A:
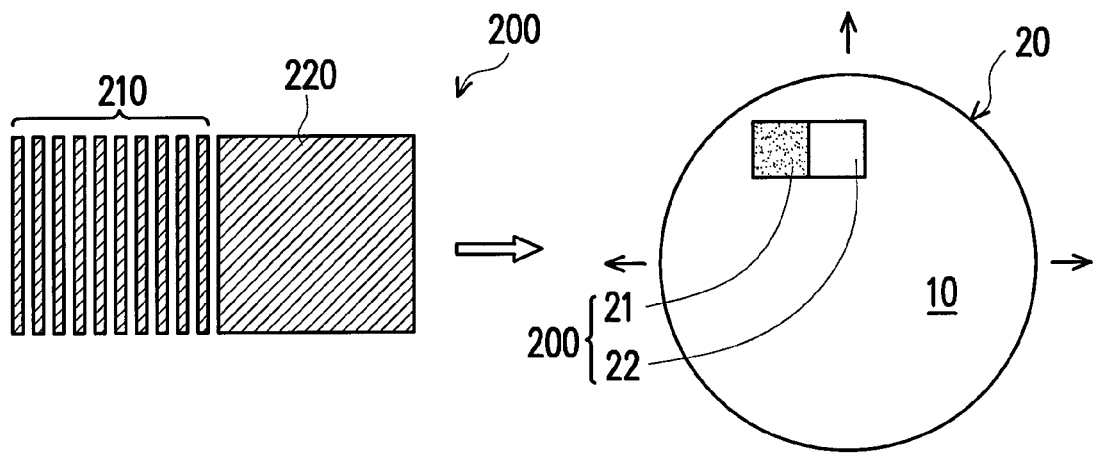
FIG. 2A illustrates an alignment mark according to a first embodiment of this invention as well as its use in a method of getting a position reference for a wafer according to the first embodiment of this invention.

FIG. 2A illustrates an alignment mark according to the first embodiment of this invention as well as its use in a method of getting a position reference for a wafer according to the first embodiment.

Referring to FIG. 2A, the alignment mark 200 includes an array pattern 210 as a dense pattern and a single block pattern 220 as a block-like pattern that are formed from the pre-layer. The array pattern 210 includes a plurality of parallel linear patterns having only one pitch, wherein each linear pattern has a y-directional orientation. As detected in visible light, the array pattern 210 is shown as a dark image 21 and the block pattern 220 is shown as a bright image 22 in the detector 20 of the alignment tool (not shown), so the alignment mark 200 has a high contrast and can be easily located on the wafer 10 to serve as a position reference. The alignment tool may be one used in a wafer checking process, such as an overlay checking process. The overlay checking machine used may be one of the KLA-Tencor series, which is equipped with a overlay metrology tool as an alignment tool utilizing visible light for an alignment action.

Figure 2B:
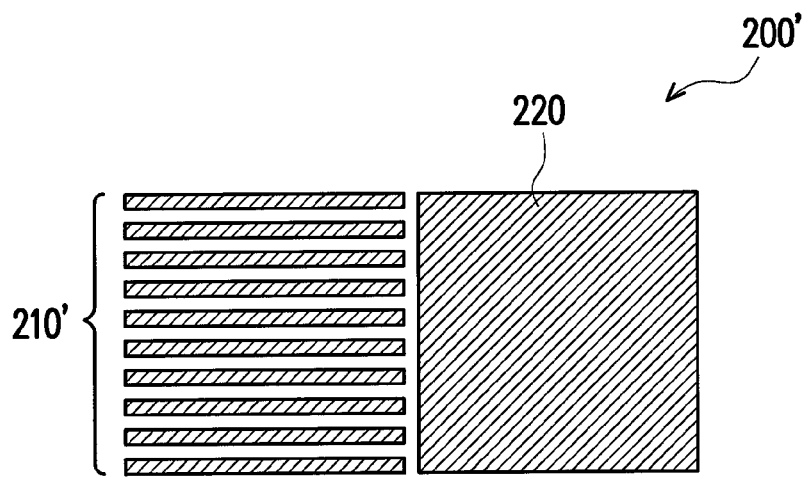
FIG. 2B illustrates another alignment mark according to the first embodiment of this invention.

FIG. 2B illustrates another alignment mark according to the first embodiment. The alignment mark 200' is similar to that (200) in FIG. 2A except that the array pattern 210' includes a plurality of parallel linear patterns each with an x-directional orientation.

Figure 3A:
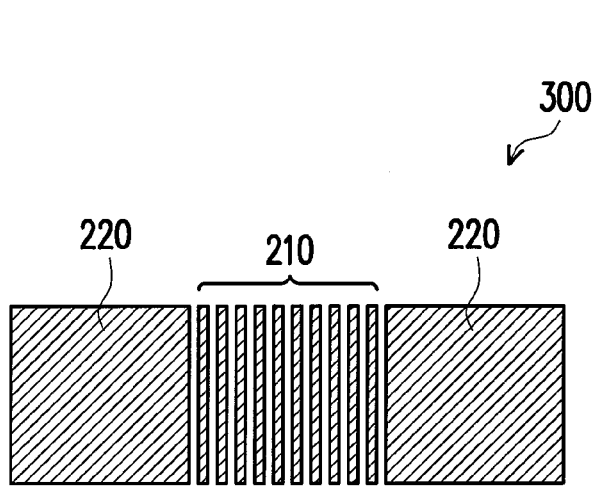
FIGS. 3A-3B illustrate two alignment marks according to a second embodiment of this invention.
Figure 3B:
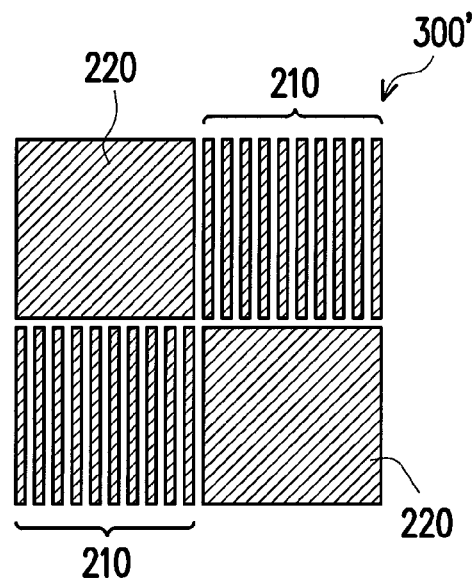

Moreover, the number of the array pattern and that of the block pattern both are not limited to be one. FIGS. 3A-3B illustrate two alignment marks according to the second embodiment of this invention where at least one of the array pattern and the block pattern has a number more than one.

Referring to FIG. 3A, the alignment mark 300 is derived from the alignment mark 200 in FIG. 2A by adding another block pattern 220 at the left side of the array pattern 210 adjacent to the array pattern 210. In general, the alignment mark of this embodiment may include one array pattern 210 and a plurality of block patterns 220 adjacent thereto. Analogously, the alignment mark may include one block pattern 220 and a plurality of array patterns 210 adjacent thereto.

Referring to FIG. 3B, the alignment mark 300' is derived from the alignment mark 200 in FIG. 2A by adding another block pattern 220 at the upper side of the array pattern 210 adjacent to the array pattern 210 and adding another array pattern 210 at the upper side of the block pattern 220 adjacent to the block pattern 220. In general, the alignment mark may include a plurality of array patterns 210 and a plurality of block patterns 220, wherein each array pattern 210 is adjacent to at least one block pattern 220 and each block pattern 220 is adjacent to at least one array pattern 210.

Figure 4A:
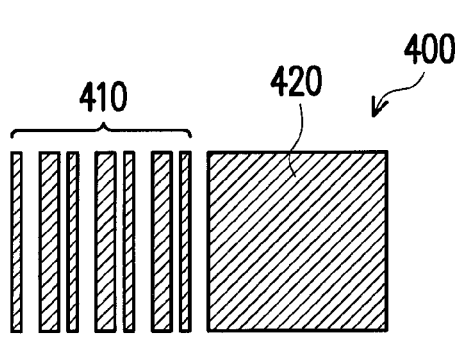
FIGS. 4A-4B illustrate two alignment marks according to a third embodiment of this invention.
Figure 4B:
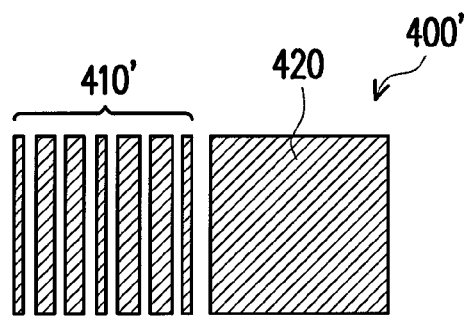

Moreover, the array pattern as a dense pattern is not limited to have only one pitch, and may have two or more pitches. FIGS. 4A-4B illustrate two such alignment marks according to the third embodiment of this invention. The alignment mark 400 in FIG. 4A includes an array pattern 410 having two pitches and a single block pattern 420 like the above block pattern 220. The alignment mark 400' in FIG. 4B includes an array pattern 410' having more than two pitches and a block pattern 420.

Figure 5:
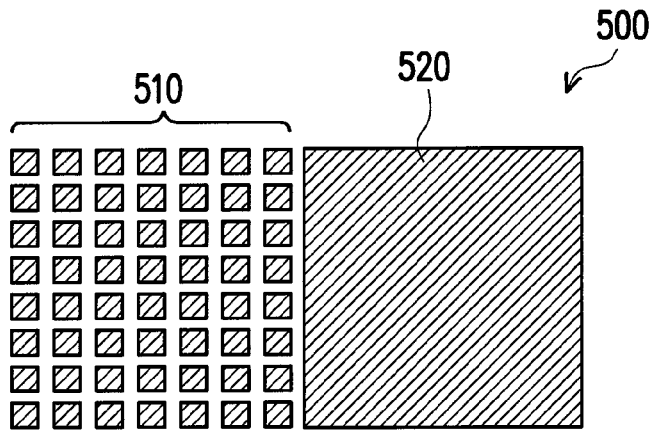
FIG. 5 illustrates an alignment mark according to a fourth embodiment of this invention.

Moreover, the array pattern as a dense pattern is not limited to be a 1D array pattern, and may be a 2D array pattern. FIG. 5 illustrates such an alignment mark according to the fourth embodiment of this invention. The alignment mark 500 in FIG. 5 includes a 2D array pattern 510 and a single block pattern 520 adjacent thereto.

Figure 6:
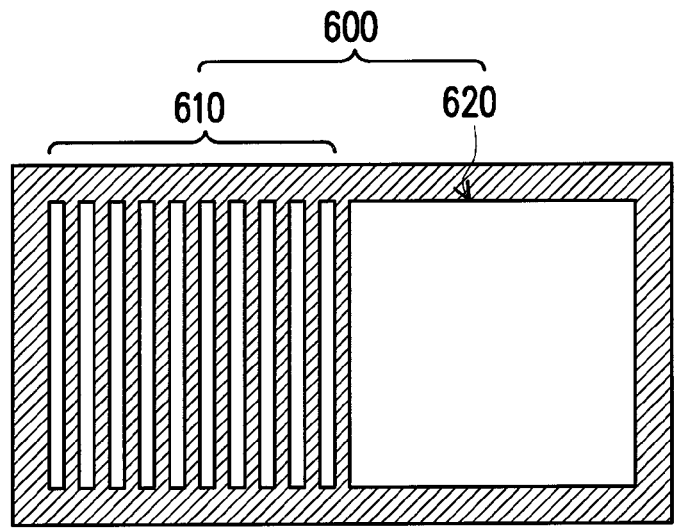
FIG. 6 illustrates an alignment mark according to a fifth embodiment of this invention.

Moreover, the array pattern and the block pattern are not limited to be formed from a portion of the pre-layer and may alternatively be formed as openings in a portion of the pre-layer. FIG. 6 illustrates such an alignment mark 600 according to the fifth embodiment of this invention, which includes a single block pattern 620 as a wide opening in a portion of the pre-layer and an array pattern 610 including a plurality of y-orientation trenches in the portion of the pre-layer. Please also refer to FIG. 2A, the alignment mark 600 is exactly in the inverse tone of the alignment mark 200 in FIG. 2A.

Figure 7A:
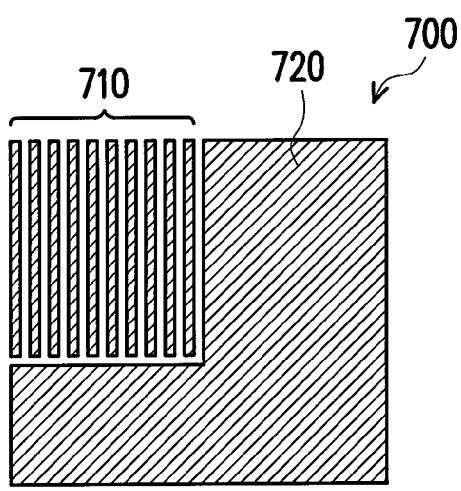
FIGS. 7A-7B illustrate two alignment marks according to a sixth embodiment of this invention.
Figure 7B:
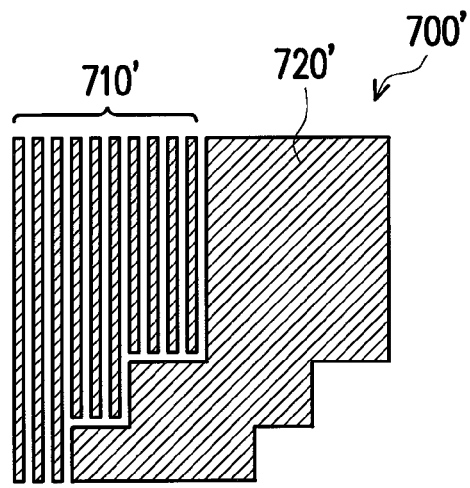

Moreover, each of the array pattern and the block pattern is not limited to have a regular shape like a rectangular or square shape, and at least one of the array pattern and the block pattern may have an irregular shape. FIGS. 7A-7B illustrate two such alignment marks according to the sixth embodiment of this invention.

Referring to FIG. 7A, the alignment mark 700 includes an array pattern 710 with a regular (rectangular or square) shape and a single block pattern 720 with an irregular shape adjacent to two neighboring sides of the array pattern 710. The alignment mark 700' in FIG. 7B includes an array pattern 710' with an irregular shape and a single block pattern 720' also with an irregular shape.

Figure 8A:
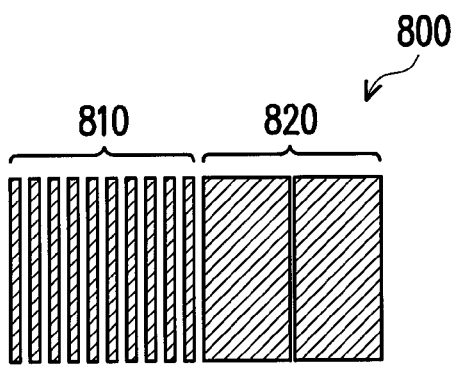
FIGS. 8A-8B illustrate two alignment marks according to a seventh embodiment of this invention.
Figure 8B:
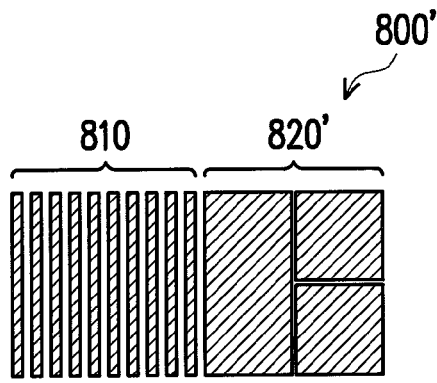

Moreover, the block-like pattern of the alignment mark of this invention is not limited to include a single block pattern, but may alternatively include two or more neighboring block patterns. FIGS. 8A-8B illustrate two such alignment marks according to the seventh embodiment of this invention.

Referring to FIG. 8A, the alignment mark 800 includes an array pattern 810 as a dense pattern and a block-like pattern 820 including two neighboring block patterns. The alignment mark 800' in FIG. 8B includes an array pattern 810 and a block-like pattern 820' including three neighboring block patterns.

It is further noted that the above variations in the array pattern as the dense pattern and in the block-like pattern as shown in FIGS. 2A-2B, 3A-3B, 4A-4B, 5, 6, 7A-7B and 8A-8B can be combined as required. For example, the alignment mark may include a 2D array pattern and a block-like pattern including two or more block patterns, wherein the 2D array pattern have two or more pitches and the 2D array pattern and the block patterns are all formed as openings in the pre-layer.

Even when an opaque film is included in the film stack, the alignment mark of the invention is shown as at least one dark image and at least one bright image adjacent thereto as detected in visible light, and thus has a high contrast and can be located easily in visible light for the recipe setup.

This invention has been disclosed above in the preferred embodiments, but is not limited to those. It is known to persons skilled in the art that some modifications and innovations may be made without departing from the spirit and scope of this invention. Hence, the scope of this invention should be defined by the following claims.

What is claimed is:

1. An alignment mark, comprising at least one dense pattern, at least one block-like pattern adjacent to the at least one dense pattern, and an opaque film over the at least one dense pattern and the at least one block-like pattern, and shown as at least one dark image and at least one bright image adjacent thereto.

2. The alignment mark of claim 1, wherein the at least one dense pattern comprises an array pattern.

3. The alignment mark of claim 2, wherein the array pattern comprises a plurality of parallel linear patterns.

4. The alignment mark of claim 3, wherein each linear pattern has an x-directional orientation or a y-directional orientation.

5. The alignment mark of claim 2, wherein the array pattern has only one pitch, or has two or more pitches.

6. The alignment mark of claim 2, wherein the array pattern comprises a 1D array pattern or a 2D array pattern.

7. The alignment mark of claim 1, wherein there are one dense pattern and a plurality of block-like patterns adjacent thereto, or there are one block-like pattern and a plurality of dense patterns adjacent thereto.

8. The alignment mark of claim 1, wherein there are a plurality of dense patterns and a plurality of block-like patterns, each dense pattern is adjacent to at least one block-like pattern, and each block-like pattern is adjacent to at least one dense pattern.

9. The alignment mark of claim 1, wherein the at least one dense pattern and at least one block-like pattern are formed from a portion of a pre-layer.

10. The alignment mark of claim 1, wherein the at least one dense pattern and at least one block-like pattern are formed as openings in a portion of a pre-layer.

11. The alignment mark of claim 1, wherein at least one of the at least one dense pattern and the at least one block-like pattern has an irregular shape.

12. The alignment mark of claim 1, wherein the at least one block-like pattern comprises a single block pattern, or comprises two or more neighboring block patterns.

13. A method of getting a position reference for a wafer, comprising:
   forming an alignment mark comprising at least one dense pattern, at least one block-like pattern adjacent to the at least one dense pattern, and an opaque film over the at least one dense pattern and the at least one block-like pattern; and
   detecting the alignment mark which is shown as at least one dark image and at least one bright image adjacent thereto that are formed by the at least one dense pattern and the at least one block-like pattern.

14. The method of claim 13, which is applied to a checking process of the wafer.

15. The method of claim 14, wherein the checking process comprises an overlay checking process.

16. The method of claim 13, wherein the at least one dense pattern comprises an array pattern.

17. The method of claim 16, wherein the array pattern comprises a plurality of parallel linear patterns.

18. The method of claim 17, wherein each linear pattern has an x-directional orientation or a y-directional orientation.

19. The method of claim 16, wherein the array pattern has only one pitch, or has two or more pitches.

20. The method of claim 16, wherein the array pattern comprises a 1D array pattern or a 2D array pattern.

21. The method of claim 13, wherein there are one dense pattern and a plurality of block-like patterns adjacent thereto, or there are one block-like pattern and a plurality of dense patterns adjacent thereto.

22. The method of claim 13, wherein there are a plurality of dense patterns and a plurality of block-like patterns, each dense pattern is adjacent to at least one block-like pattern, and each block-like pattern is adjacent to at least one dense pattern.

23. The method of claim 13, wherein the at least one dense pattern and at least one block-like pattern are formed from a portion of the pre-layer.

24. The method of claim 13, wherein the at least one dense pattern and at least one block-like pattern are formed as openings in a portion of the pre-layer.

25. The method of claim 13, wherein at least one of the at least one dense pattern and the at least one block-like pattern has an irregular shape.

26. The method of claim 13, wherein the at least one block-like pattern comprises a single block pattern, or comprises two or more neighboring block patterns.

* * * * *